(12) United States Patent
Hawtof et al.

(10) Patent No.: US 7,083,678 B2
(45) Date of Patent: *Aug. 1, 2006

(54) METHOD AND APPARATUS FOR MAKING A CRYSTAL PRE-MELT

(75) Inventors: Daniel W. Hawtof, Corning, NY (US); Nicholas LeBlond, Painted Post, NY (US); Christopher S. Thomas, Horseheads, NY (US)

(73) Assignee: Corning Incorporated, Corning, NY (US)

( * ) Notice: Subject to any disclaimer, the term of this patent is extended or adjusted under 35 U.S.C. 154(b) by 226 days.

This patent is subject to a terminal disclaimer.

(21) Appl. No.: 10/696,453

(22) Filed: Oct. 29, 2003

(65) Prior Publication Data

US 2005/0092232 A1    May 5, 2005

(51) Int. Cl.
*C30B 13/02* (2006.01)
*C30B 13/08* (2006.01)
*C30B 13/28* (2006.01)

(52) U.S. Cl. ............................ 117/81; 117/78; 117/83; 117/940

(58) Field of Classification Search ................ 117/78, 117/81, 82, 83, 940
See application file for complete search history.

(56) References Cited

U.S. PATENT DOCUMENTS

6,238,479 B1    5/2001    Oba ............................ 117/68

*Primary Examiner*—Felisa Hiteshew
(74) *Attorney, Agent, or Firm*—Walter M. Douglas (57) ABSTRACT

An apparatus for making a crystal pre-melt includes a hermetically-sealed muffle furnace made of a non-porous refractory material, at least one port for entry and exit of gaseous substance within the muffle furnace, a temperature-controlled zone defined inside the muffle furnace, and a crucible for holding crystal raw material in solid or molten form inside the muffle furnace. The crystal pre-melt is made by disposing crystal raw material in loose powder, pressed powder, granular, or densified form in the temperature-controlled zone, heating the temperature-controlled zone to a treatment temperature that enables reaction between a fluorinating agent and oxides in the crystal raw material, reacting the fluorinating agent with the crystal raw material to produce volatile gases, removing the volatile gases from the muffle furnace, heating the crystal raw material to form a melt, and solidifying the melt to form the crystal pre-melt.

11 Claims, 6 Drawing Sheets

METHOD AND APPARATUS FOR MAKING A CRYSTAL PRE-MELT

BACKGROUND OF INVENTION

The invention relates to methods and apparatus for making crystals. While not wishing to be bound to a particular group of crystals, it is convenient in the following discussion to focus on a particular group of crystals. One group of crystals of interest is optical fluoride crystals. Single-grained optical fluoride crystals are useful in applications requiring transmission at short wavelengths, e.g., in the vacuum ultraviolet region. At present, $CaF_2$ crystal is the most viable lens material for 157-nm microlithography.

Optical fluoride crystals as well as other types of crystals can be grown in two steps. The first step is a pre-melt step in which crystal raw material in powder or granular form is melted and then rapidly cooled into a solid body, which herein will be referred to as a crystal pre-melt. The second step is a growth step in which the crystal pre-melt is melted and then used to grow one or more crystals.

Figure 1A:
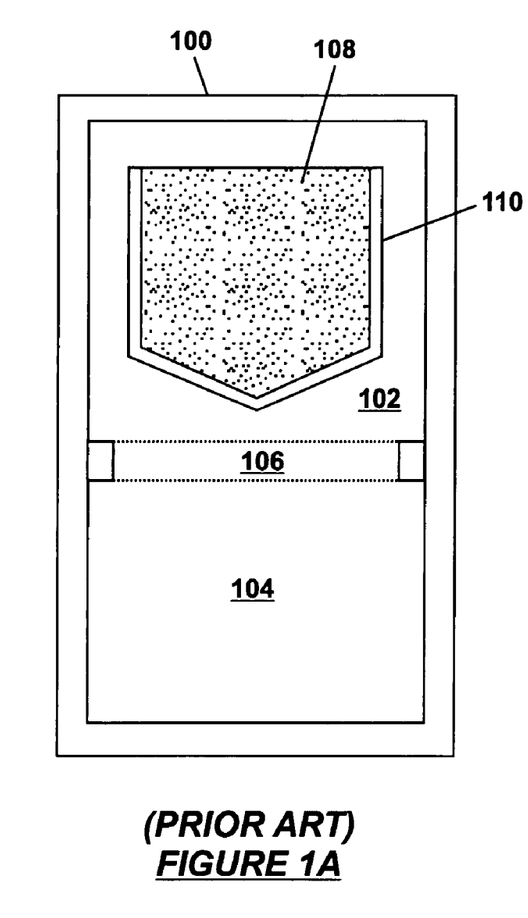
FIGS. 1A and 1B illustrate a Bridgman-Stockbarger process for growing crystals.
Figure 1B:
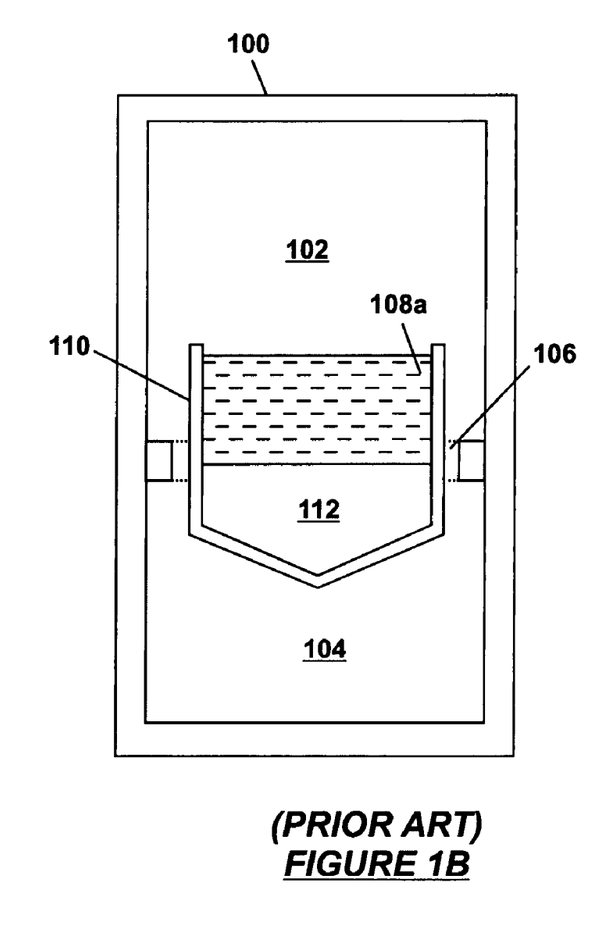

Single-grained crystals are commonly grown using the Bridgman-Stockbarger process. As illustrated in FIG. 1A, the Bridgman-Stockbarger process takes place in a vertical furnace 100 having an upper zone 102 and a lower zone 104. A middle or thermal gradient zone 106 is defined between the upper zone 102 and the lower zone 104 by making the temperature of the upper zone 102 higher than the temperature of the lower zone 104. The growth step starts with loading of a crystal pre-melt 108 into a crystal growth crucible 110. With the growth crucible 110 in the upper zone 102, the upper zone 102 is then heated to a temperature sufficient to melt the crystal pre-melt 108. After melting the crystal pre-melt 108, the growth crucible 110 is lowered from the upper zone 102, through the thermal gradient zone 106, into the lower zone 104. As shown in FIG. 1B, as the growth crucible 110 passes through the thermal gradient zone 106, a phase transition occurs inside the molten crystal pre-melt 108a, creating a crystal front 112. The crystal front 112 propagates inside the growth crucible 110, within the molten crystal pre-melt 108a, as long as the growth crucible 110 continues to move downwardly into the lower zone 104.

Returning to FIG. 1A, the crystal pre-melt 108 is made by subjecting relatively pure crystal raw material in powder or granular form to a pre-melt step. The main purpose of the pre-melt step is to increase the bulk density of the crystal raw material so that the volume of the crystal growth furnace can be used efficiently. For example, synthetic $CaF_2$ powder has an apparent density of 1.1 g/cm$^3$, and crystals grown from $CaF_2$ powder have an apparent density that is close to the theoretical density of $CaF_2$, i.e., 3.18 g/cm$^3$. Thus, if synthetic $CaF_2$ powder is used directly as the crystal raw material, two-thirds of the volume of the crystal growth furnace will not be used, or at least, not used efficiently. Through a pre-melt step, the apparent density of the $CaF_2$ raw material can be increased to approximately 2.2 g/cm$^3$, which would be much closer to the density of the grown $CaF_2$ crystal.

The pre-melt step typically includes a treatment step in which oxide impurities are scavenged from the crystal raw material prior to melting the crystal raw material. Commonly, the treatment step involves mixing a solid fluorinating agent, e.g., $PbF_2$, $ZnF_2$, or polytetrafluoroethylene (PTFE), with the crystal raw material and then heating the mixture to the melting point of the crystal raw material. At this temperature, the solid fluorinating agent reacts with oxides in the crystal raw material to form volatile gases that escape from the crystal raw material. However, use of solid fluorinating agent to scavenge oxide impurities has a drawback in that impurities such as $Pb^{2+}$, $Zn^{2+}$, or C can remain in the crystal raw material after treatment. For optical fluoride crystals, the presence of these impurities, even at trace levels, can result in absorption bands that are detrimental to transmission at wavelengths below 200 nm.

Recently, gaseous fluorinating agents, such as $CF_4$, HF, $SF_6$, and $BF_3$, have been proposed as alternatives to solid fluorinating agents in scavenging oxide impurities. With gaseous fluorinating agents, the risk of leaving harmful impurities such as $Pb^{2+}$, $Zn^{2+}$, or C in the grown crystal is relatively low or non-existent. However, use of gaseous fluorinating agents in scavenging oxide impurities in conventional settings poses various challenges. For example, the furnace and furnace elements, e.g., crucibles, thermocouples, and resistors, used in the pre-melt step are typically made of pure graphite or other materials that are susceptible to corrosion by the gaseous fluorinating agents, especially in the presence of oxygen atmosphere and/or at elevated temperatures. For example, $CF_4$ attacks thermocouples at temperatures above 1100° C. Further, pure graphite is porous and tends to outgas. Outgassing of $H_2O$, $CO_2$, or CO from the graphite parts may contribute to contamination of the crystal pre-melt after treatment.

From the foregoing, there is desired a practical method of making a crystal pre-melt from crystal raw material involving use of a gaseous fluorinating agent as an oxide scavenger.

SUMMARY OF INVENTION

In one aspect, the invention relates to an apparatus for making a crystal pre-melt. The apparatus comprises a hermetically-sealable muffle furnace made of a non-porous refractory material, at least one port for entry and exit of gaseous substance within the muffle furnace, a temperature-controlled zone defined inside the muffle furnace, and a crucible for holding crystal raw material in solid or molten form inside the muffle furnace.

In another aspect, the invention relates to a method of making a crystal pre-melt. The method comprises disposing crystal raw material in loose powder, pressed powder, granular, or densified form in a temperature-controlled zone defined in a muffle furnace made of a non-porous refractory material and hermetically sealing the muffle furnace. The method further includes heating the temperature-controlled zone to a treatment temperature that enables reaction between a fluorinating agent and oxides in the crystal raw material, reacting the fluorinating agent with the crystal raw material to produce volatile gases, removing the volatile gases from the muffle furnace, heating the crystal raw material to form a melt, and solidifying the melt to form the crystal pre-melt.

Other features and advantages of the invention will be apparent from the following description and the appended claims.

DETAILED DESCRIPTION OF PREFERRED EMBODIMENTS

The invention will now be described in detail with reference to a few preferred embodiments, as illustrated in accompanying drawings. In the following description, numerous specific details are set forth in order to provide a thorough understanding of the invention. However, it will be apparent to one skilled in the art that the invention may be practiced without some or all of these specific details. In other instances, well-known features and/or process steps have not been described in detail in order to not unnecessarily obscure the invention. The features and advantages of the invention may be better understood with reference to the drawings and discussions that follow.

Embodiments of the invention provide an apparatus and a method for making a crystal pre-melt from crystal raw material. The method involves use of a fluorinating agent to scavenge oxide impurities from the crystal raw material prior to forming the crystal pre-melt. The apparatus includes a muffle furnace made of a non-porous refractory material, such as quartz, alumina, silicon carbide, vitreous carbon, vitreous graphite, or glassy carbon-coated graphite. By constructing the muffle furnace from a non-porous refractory material, the crystal raw material is protected from contamination through outgassing of the muffle furnace material. Also, the non-porous refractory material is inert in the sense that it does not react with the process gases under the process conditions used in making the crystal pre-melt.

The crystal pre-melt made by the apparatus and method of the invention could be used to grow crystals. The type of crystals grown would depend on the composition of the crystal raw material from which the crystal pre-melt is made. One group of crystal raw material that is of interest herein is fluoride crystal raw material. In one embodiment, the fluoride crystal raw material includes a metal fluoride selected from the group consisting of $CaF_2$, $BaF_2$, $MgF_2$, $SrF_2$, LiF, NaF, $(M_1)_x(M_2)_{1-x}F_2$, and $M_3AlF_6$, and mixtures thereof, where $M_1$ is selected from the group consisting of Li and K; $M_2$ is selected from the group consisting of Ca, Ba, Mg, and Sr; $M_3$ is selected from the group consisting of Li, Na, K, Rb, and Cs; and x is in the range from 0 to 1, preferably in a range from 0.01 to 0.99. The fluoride crystal raw material may also include mixed metal fluorides wherein a metal fluoride selected from the lanthanide series, for example, lanthanum, ytterbium, yttrium, or others of the series, is used as one of $M_1$ or $M_2$, or is used in addition to $M_1$ and $M_2$. Those skilled in the art will recognize the possible combinations.

Figure 2A:
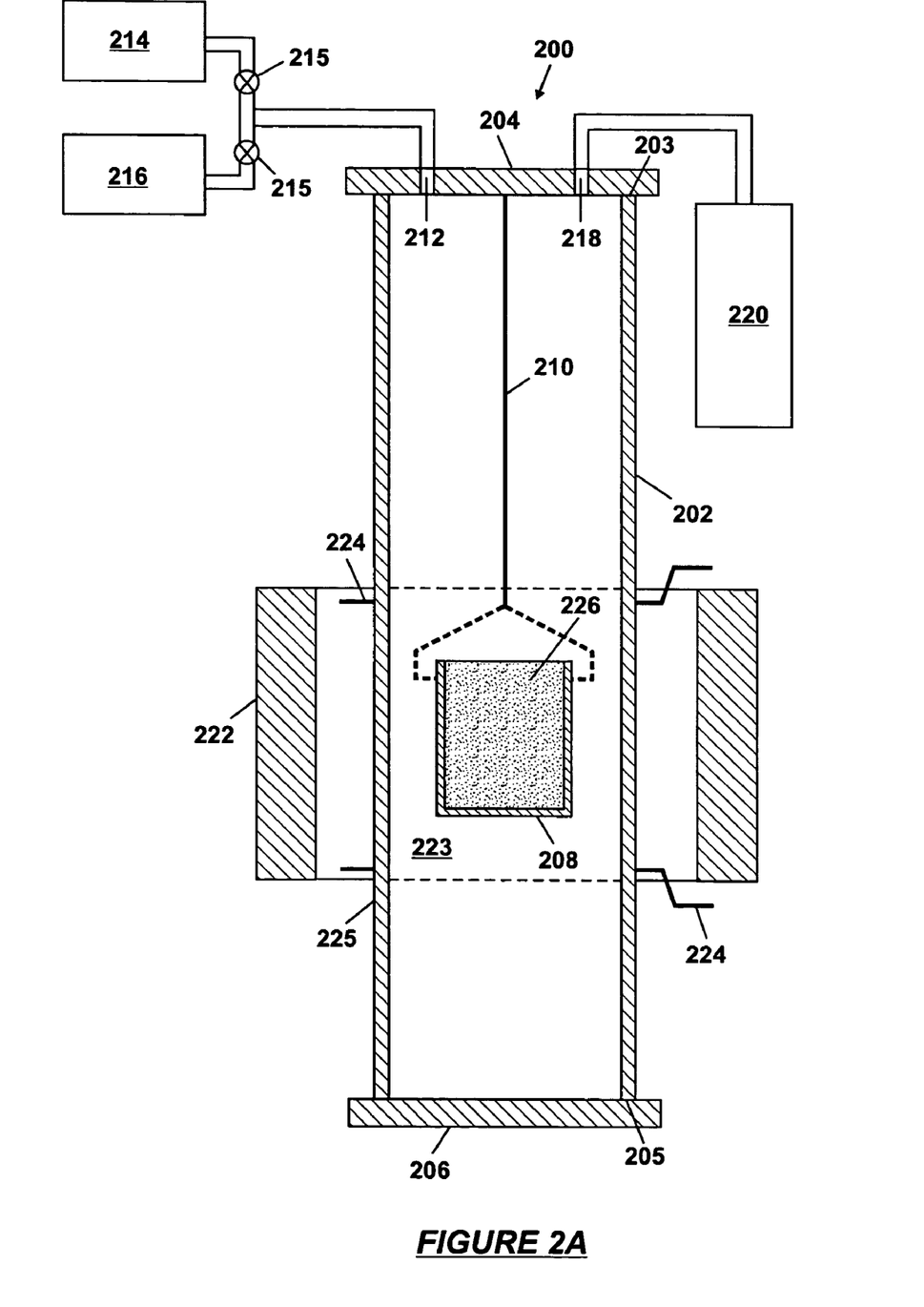
FIG. 2A is a schematic of an apparatus for forming a crystal pre-melt according to one embodiment of the invention.

Referring now to FIG. 2A, an apparatus 200 for making a crystal pre-melt according to an embodiment of the invention includes a muffle furnace 202 that is constructed from a non-porous refractory material. Examples of suitable non-porous refractory materials include quartz, alumina, silicon carbide, vitreous carbon, vitreous graphite, glassy carbon-coated graphite, and a combination of these materials. These materials are also inert in that they are not expected to react with the process gases under the process conditions in which the crystal pre-melt will be made inside the muffle furnace 202. By constructing the muffle furnace 202 from a non-porous refractory material, the crystal pre-melt made inside the muffle furnace is protected from contamination through outgassing of the muffle furnace material.

The upper and lower ends 203, 205 of the muffle furnace 202 are covered with end caps 204, 206, respectively. Preferably, the end caps 204, 206 make a sealed contact with the muffle furnace 202, providing a hermetically-sealed environment inside the muffle furnace 202. A variety of sealing mechanisms, such as metal-to-metal seal, O-ring seal, etc., can be used between the muffle furnace 202 and the end caps 204, 206 to achieve the sealed contact. To avoid contamination of the crystal pre-melt through outgassing of the end cap material, the end caps 204, 206 are also preferably constructed from a non-porous refractory material, such as listed above for the muffle furnace 202.

Either or both of the end caps 204, 206 or the wall of the muffle furnace 202 may include one or more ports through which gases can flow into and out of the muffle furnace 202. As illustrated in FIG. 2A, an inlet port 212 is provided in the end cap 204. The inlet port 212 may be selectively connected to gas sources 214, 216. As an example, the gas source 214 could contain a gaseous fluorinating agent, and the gas source 216 could contain an inert gas. Valves 215 may be provided to control rate of flow from the gas sources 214, 216 into the muffle furnace 202. In FIG. 2A, an outlet port 218 is also provided in the end cap 204. The outlet port 218 may be connected to an effluent treatment chamber 220, which may include a scrubber (not shown) to remove or decompose any gaseous fluorinating agent in the effluent of the muffle furnace 202. Examples of scrubbers include heated metal oxide such as soda lime or a plasma system. Although not shown, a vacuum system could also be incorporated to suck out gas from the muffle furnace 202 through the outlet port 218.

In one embodiment, a variable temperature heater 222, which may be made of one or more heating elements, is mounted outside the muffle furnace 202 to maintain a desired temperature in at least a zone 223 of the muffle furnace 202. When more than one heating element is used the elements can be individually controlled to provide greater temperature flexibility. The temperature in the zone 223 of the muffle furnace 202 can be measured using thermocouples 224, and the output of the thermocouples 224 can be used to control the power supplied to the heater 222. To avoid contact between the thermocouples 224 and process gases in the muffle furnace 202, the thermocouples 224 are preferably mounted external to the muffle furnace 202, e.g., on the outside wall 225 of the muffle furnace 202. To allow uniform heat distribution inside the zone 223 during operation, the heater 222 may be moved, e.g., rotated or translated, relative to the zone 223.

The invention is not limited to use of an external heat source, such as variable temperature heater 222, to provide a desired temperature profile in the zone 223. Inductive heating or resistive heating could also be used to provide the desired temperature profile in the zone 223. For example, in a situation where the muffle furnace 202 is made of a conductive non-porous refractory material, such as vitreous graphite, vitreous carbon, or silicon carbide, the muffle furnace 202 could be used as an electromagnetic induction susceptor when coupled with an induction coil. Alternatively, the muffle furnace 202 itself could serve as a heating element if a controlled current is placed across it.

In one embodiment, a crucible 208 is supported in the temperature-controlled zone 223 of the muffle furnace 202. As an example, the crucible 208 could be suspended in the zone 223 on a handle 210 that is coupled to the end cap 204. In FIG. 2A, the crucible 208 holds the crystal raw material 226 to be transformed into a crystal pre-melt. The handle 210 could be coupled to the end cap 204 in such a way that it allows the crucible 208 to be movable inside the zone 223. For example, it may be advantageous to rotate and/or translate the crucible 208 inside the zone 223 so that the crystal raw material 226 is uniformly exposed to the process gases and/or uniformly heated. To prevent contamination of the crystal raw material 226, the crucible 208 and handle 210 are preferably constructed of an inert refractory material. To avoid contamination of the crystal raw material 226 through outgassing of crucible/handle material, the inert refractory material is preferably non-porous.

The invention is not limited to suspension of the crucible 208 in the muffle furnace 202 through use of the handle 210. For example, the crucible 208 could be supported on a platform (not shown), which is itself supported inside the muffle furnace 202. A mechanism (not shown) may be coupled to the platform to rotate and/or translate the platform inside the muffle furnace 202 if desired.

In one embodiment, a method of making crystal pre-melt involves loading crystal raw material 226 in powder or granular form into the crucible 208. The crystal raw material 226 may initially have a high oxygen content, e.g., much greater than 200 ppm by weight. The crucible 208 is then suspended or supported inside the temperature-controlled zone 223 of the muffle furnace 202, and the end caps 204, 206 are fitted at the ends of the muffle furnace 202 to provide a gas-tight environment inside the muffle furnace 202. Next, the muffle furnace 202 is purged and filled with a purge gas, which is typically an inert gas such as argon, helium, or nitrogen. Alternatively, the muffle furnace 202 can be first evacuated, e.g., through the use of a vacuum system, and then filled with a purge gas.

The sealed muffle furnace 202 is heated, typically from room temperature, to treatment temperature. Heating may occur simultaneously with purging and/or filling the muffle furnace 202 with a purge gas. Heating to purification temperature can occur in one step or in multiple steps and may include one or more stabilization steps. The treatment temperature may be below, at, or above the melting point of the crystal raw material 226. In general, the treatment temperature should be high enough to enable reaction between the crystal raw material 226 and the fluorinating agent to be used in scavenging oxide impurities from the crystal raw material 226. To facilitate diffusion of gases through the crystal raw material 226, the treatment temperature should not be so high as to significantly increase the density of the crystal raw material 226 during the treatment phase.

When the treatment temperature is reached, the inert gas in the muffle furnace 202 is replaced with a gaseous fluorinating agent, such as $CF_4$, $NF_3$, $SF_6$, $BF_3$, $C_2F_4$, HF, $F_2$, or a mixture of these fluorides, or similar fluorination gases, for example gaseous $XeF_2$, known in the art. The gaseous fluorinating agent may be carried into the muffle furnace 202 in a stream of inert gas, such as argon, helium, or nitrogen. The amount of gaseous fluoride in the inert gas stream may be in a range from 1% to 100% by weight. The inert gas may be premixed with the gaseous fluorinating agent or provided from a separate source. In one embodiment, the flow rate of the gaseous fluorinating agent is adjusted such that the pressure in the muffle furnace 202 is in a range from 0.1 to 5 atm., preferably around 1 atm. The gaseous fluorinating agent is selected based on its decomposition temperature and the melting point of the crystal raw material 226. For example, $CF_4$ has a high bond energy (536 KJ/mol) and is expected to be an effective oxide scavenger at temperatures of 1000° C. Thus, $CF_4$ is better suited for treatment of high-melting crystal raw materials such as $CaF_2$. $NF_3$ and $SF_6$ are expected to produce similar scavenging effect as $CF_4$ at temperatures closer to 200 to 400° C. and 500 to 800° C., respectively, and are thus better suited for the treatment of low-melting crystal raw materials.

The crystal raw material 226 is exposed to the gaseous fluorinating agent for a selected time period; for example, 1–240 hours, preferably 10–100 hours. During this period, the gaseous fluorinating agent reacts with oxide impurities in the crystal raw material 226 to produce volatile gases, which are carried away to the effluent treatment chamber 220. The amount of oxide impurities removed from the crystal raw material 226 depends on the exposure time and treatment temperature. In general, the time required to remove oxide impurities decreases as treatment temperature increases. Also, the closer the treatment temperature is to the melting point of the crystal raw material, the shorter the time required to reduce the oxide impurity level of the crystal raw material. Gas analysis of the effluent from the muffle furnace 202 can be used to determine the completion of the treatment step. For example, the oxygen concentration of the muffle furnace effluent may be measured, and when this oxygen concentration falls below a predetermined threshold, the treatment process can be stopped.

Figure 2B:
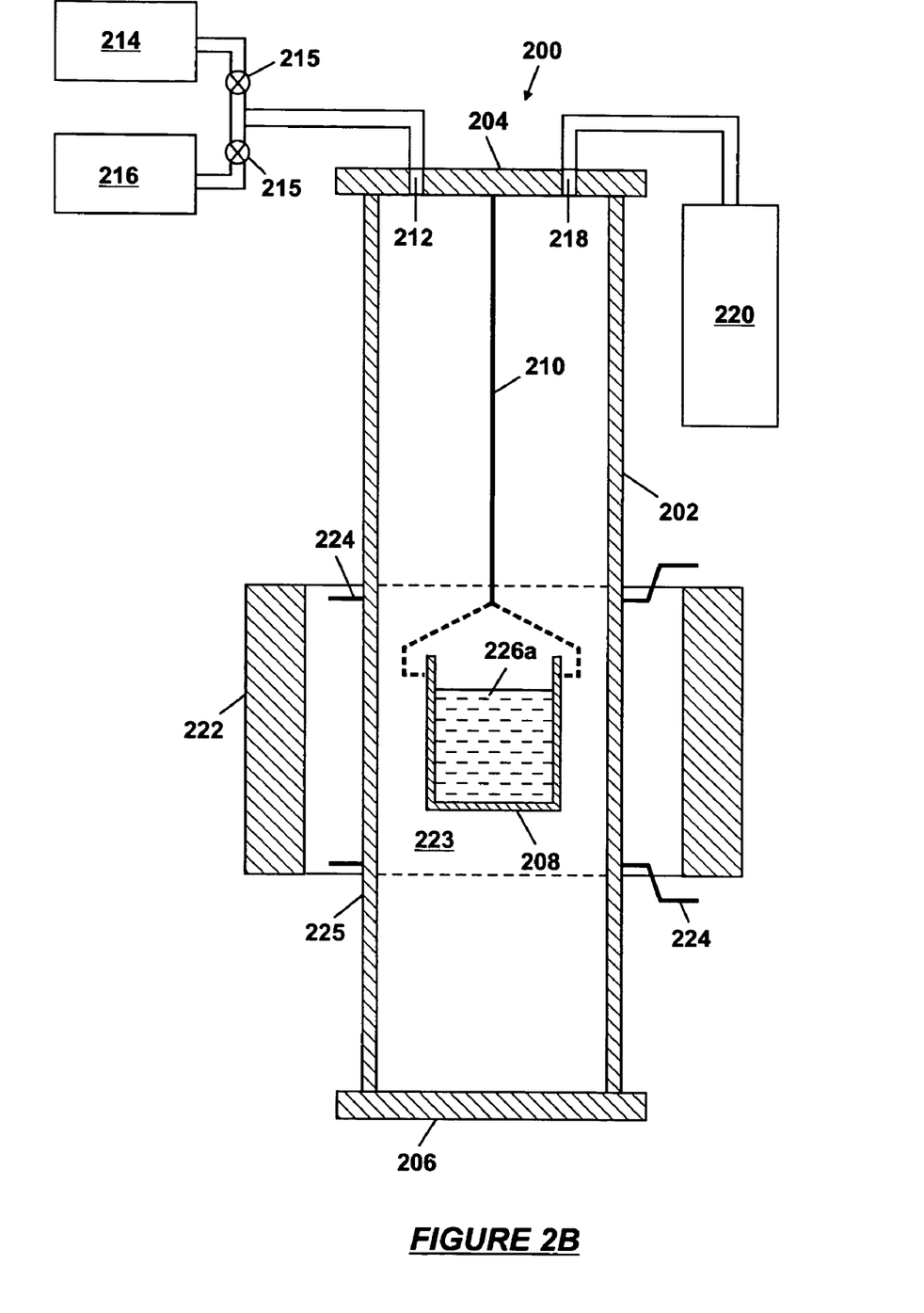
FIG. 2B shows crystal raw material in a molten condition in a crucible disposed in a muffle furnace according to one embodiment of the invention.
Figure 2C:
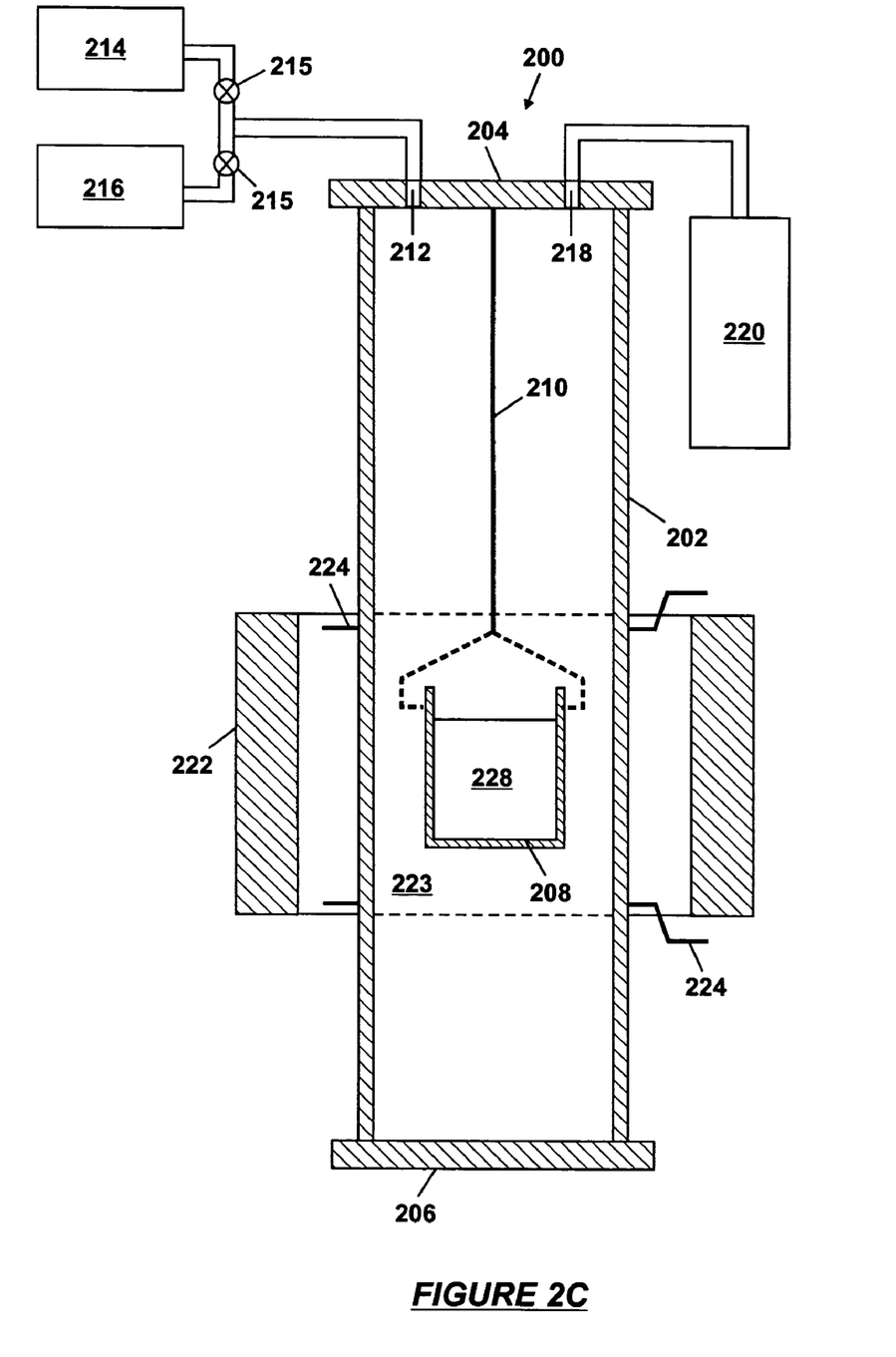
FIG. 2C shows the molten material in FIG. 2B solidified into a crystal pre-melt according to one embodiment of the invention.

When the treatment process is completed, the muffle furnace 202 is purged with a purge gas, which typically is an inert gas such as helium or argon. The muffle furnace 202 is then heated to a temperature sufficient to melt the crystal raw material 226. FIG. 2B shows the molten crystal raw material 226a inside the crucible 208. The molten crystal raw material 226a is then solidified by rapid cooling to form a crystal pre-melt. FIG. 2C shows the crystal pre-melt 228 inside the crucible 208. The solidification step does not include crystal growth in the sense that the molten material is not moved through a thermal gradient. At this point, the crystal pre-melt 228 may be removed from the muffle furnace 202 and stored in a dry inert atmosphere, e.g., in a sealed container purged by an inert gas or a container sealed under vacuum, to prevent contamination before the crystal growth step. Generally speaking, to reduce melting time in the growth furnace, the crystal pre-melt 228 will have to be crushed before it is loaded into the growth furnace. This crushing action can be a source of metallic and other forms of contamination in the crystal pre-melt 228. To avoid the crushing step, the crystal pre-melt 228 could be divided into smaller shapes inside the muffle furnace 202.

Figure 2D:
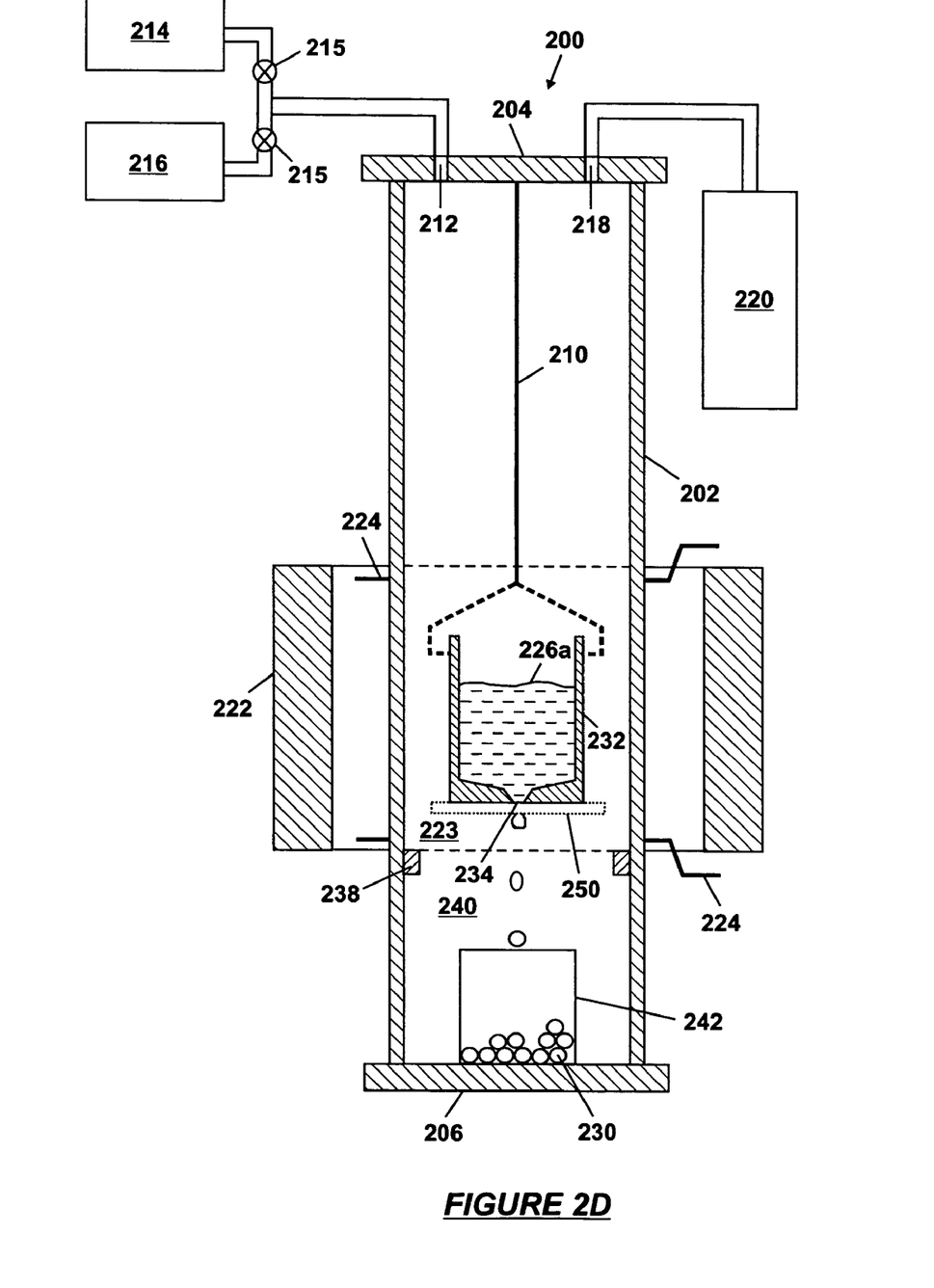
FIG. 2D shows the molten material in FIG. 2B being shaped into pellets according to another embodiment of the invention.

As illustrated in FIG. 2D, the molten crystal raw material 226a can be formed into pellets 230, as taught by Alexandre M. Mayolet in U.S. Pat. No. 6,451,106 (assigned to Corning Incorporated), to avoid the crushing step. In FIG. 2D, the crucible 232 used in holding the molten crystal raw material 226a has an opening 234 in its base. The opening 234 permits the molten material 226a to drop from the crucible 232 into a receptacle 242 positioned below the crucible 232. A removable cover 236 (shown in phantom) at the opening 234 prevents the molten material 226a from passing through the opening 234 until the operator so elects. The mechanism for removing the cover 236 is not illustrated, but may, for example, include a slide rod terminating outside the muffle furnace 202. A baffle or diaphragm 238 may be placed at a location below the level of the heater 222 to create a temperature differential between the melting zone 223 (defined by the heater 222) and a dropping zone 240 below the heater 222 where the drops of molten material 226a will solidify. The size of the droplets will be dictated by the diameter of the opening 234 at the bottom of the crucible 232.

In another embodiment of the invention, the crystal raw material used in making the crystal pre-melt is provided as a porous preform. The porous preform could be made by isostatic pressing of crystal raw material, as taught by Malcolm Ivy in U.S. patent application Ser. No. 10/611,506 (assigned to Corning Incorporated). Briefly, the process for forming the porous preform includes loading crystal raw material in powder form into a flexible mold and then applying isostatic pressure to the mold to compress the crystal raw material. The isostatic pressing could be cold, warm or hot. To facilitate handling of the preform, a preform handle made of crystal or a non-porous refractory material, such as previously listed for the muffle furnace material, could be inserted in the top of the crystal raw material so that it is molded to the top of the crystal raw material during the isostatic pressing. Alternatively, a notch can be cut at the top of the preform after isostatic pressing, and a preform handle can be inserted in the notch to facilitate handling of the preform.

Figure 2E:
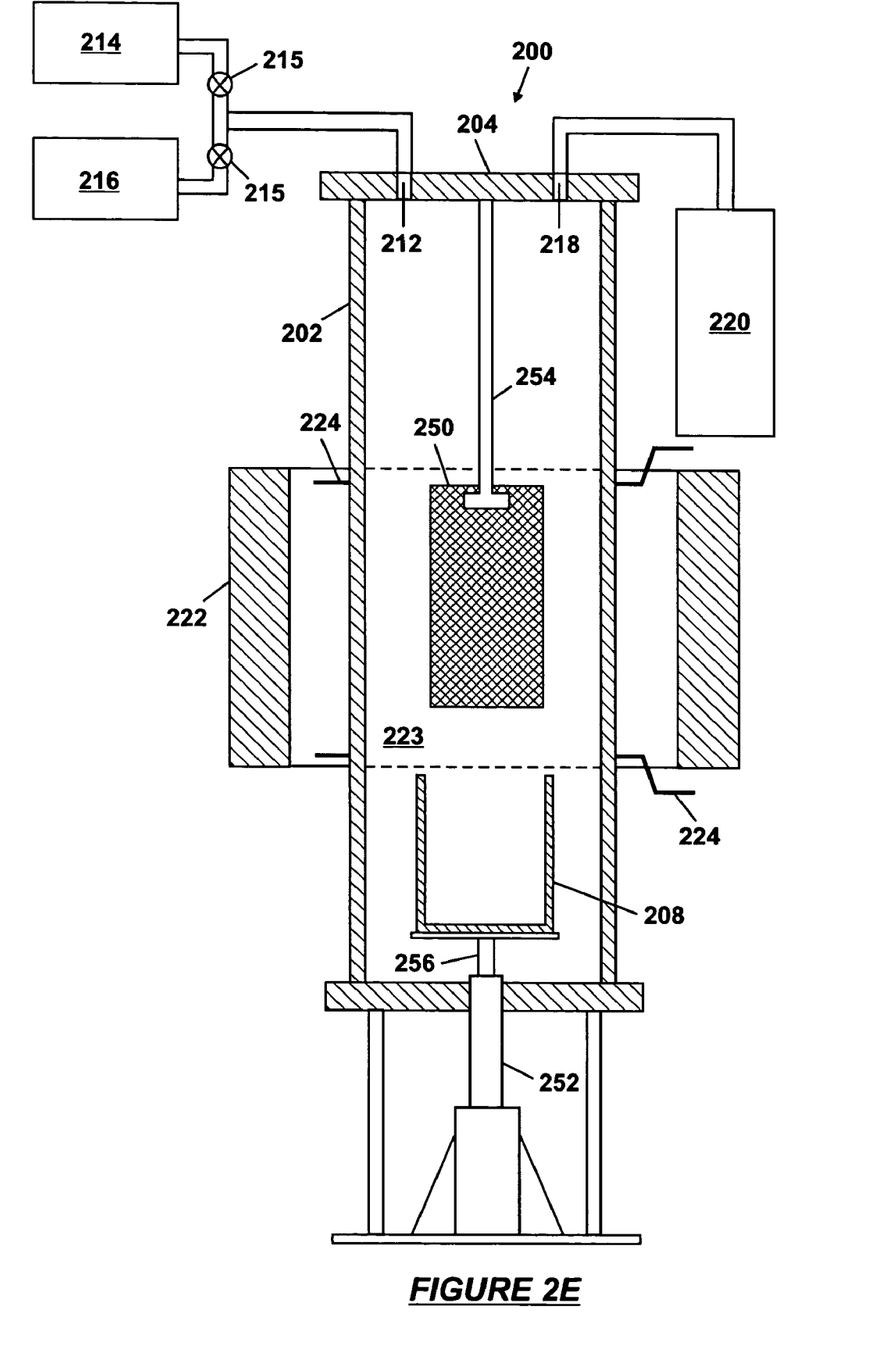
FIG. 2E shows a crystal raw material preform suspended above a crucible inside a muffle furnace according to another embodiment of the invention.

FIG. 2E shows a porous preform 250, made of crystal raw material, suspended in the muffle furnace 202. As an example, the porous preform 250 could be suspended using a preform handle 254 having one end inserted into the porous preform 250 and the other end coupled to the end cap 204. Alternatively, the porous preform 250 can be suspended by, for example, a claw-like device grasping the outside of the preform. The claw-like device is such that it exerts continuous pressure on the preform so that the preform is held in position above the waiting crucible 208 during the treatment and melting steps. The porous preform 250 is treated in the muffle furnace 202 in the same manner previously described for the powdered or granular crystal raw material. The advantage in this case is that there is no crucible in the flow path of the gaseous fluorinating agent and the porous preform 250. Thus, quicker diffusion of the gaseous fluorinating agent through the porous preform 250 is enabled, and contamination of the preform 250 with crucible material is avoided. After treating the preform 250, the preform 250 can be melted into the waiting crucible 208. A lift mechanism 252 having a sliding member 256, such as a piston or rod, could be coupled to the crucible 208 to move the crucible into the zone 223 where the preform 250 is melted. As an example, the lift mechanism 252 could be a fluid-powered actuator, such as a hydraulic or pneumatic actuator, or a mechanical actuator. The melted preform 250 can be cooled into a crystal pre-melt as previously described. Alternatively, the melted preform 250 could be shaped into pellets, as described above, or into other appropriate shapes that would allow the crushing step to be bypassed.

In one example, $CaF_2$ crystal pre-melt is made using the apparatus and method described above. The process outline is as follows:

Load $CaF_2$ raw material, if in powder form, into a crucible.

Suspend the crucible containing the $CaF_2$ raw material or suspend the $CaF_2$ preform in a cold muffle furnace and seal the muffle furnace.

Purge the muffle furnace and fill the muffle furnace with an inert gas, such as argon or helium, at atmospheric pressure+1 psig (0.068 atm) as the muffle furnace is heated to 800° C.

Optionally allow the muffle furnace to stabilize at 800° C. in the inert gas for several hours.

Ramp up the temperature in the muffle furnace to 1000° C. with the same gas and pressure.

At 1000° C., replace the inert gas in the muffle furnace with $CF_4$ to purify the $CaF_2$ raw material. To reduce the amount of $CF_4$ used, the $CF_4$ may be cycled in and out of the furnace, rather than maintaining a constant flow through the system. Alternatively, a mixture of $CF_4$ and an inert gas may be used.

Once the $CaF_2$ has been purified, replace $CF_4$ with inert gas, preferably argon.

Once only the inert gas is in the muffle furnace, heat the muffle furnace to above 1440° C., preferably 1480° C., so that the $CaF_2$ may melt into a pure liquid.

Cool the melted $CaF_2$ liquid using a variety of temperature rates (that is, programmed cooling) to form a solid body, i.e., the crystal pre-melt.

Other single metal fluorides or mixed metal fluorides can be prepared in a manner similar to the one described above. Further, although it is preferable to scavenge oxide impurities using gaseous fluorinating agents, the crystal raw material, in loose powder or granular or pressed form, may optionally include a small amount of a solid fluorinating agent, e.g., 0.5 to 2 wt % of $PbF_2$, $ZnF_2$, or other solid fluorinating agent known in the art, for scavenging oxide impurities. In this case, at the treatment temperature, the solid fluorinating agent would react with the oxide impurities in the crystal raw material, and there may be no need to introduce a gaseous fluorinating agent into the muffle furnace to scavenge the oxide impurities from the crystal raw material. However, if desired, the gaseous fluorinating agent can be used in conjunction with the solid fluorinating agent to scavenge oxide impurities from the crystal raw material.

The invention provides one or more advantages. Using a muffle furnace made from non-porous refractory material protects the crystal raw material from contamination due to outgassing of the muffle furnace material. Thermocouples can be mounted on the outside of the muffle furnace wall to prevent them from being attacked by the process gases. The level of process control over temperature, pressure, and process gas is better in a sealed muffle furnace environment than in a sealed furnace constructed from pure graphite. The option to divide the crystal pre-melt into pellets or other similar shapes would eliminate the need to crush the crystal pre-melt for the crystal growth step.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method of making a crystal pre-melt, comprising:
disposing crystal raw material in loose powder, pressed powder, granular, or densified form in a temperature-controlled zone defined in a muffle furnace made of a non-porous refractory material and hermetically sealing the muffle furnace;
heating the temperature-controlled zone to a treatment temperature that enables reaction between a fluorinating agent and oxides in the crystal raw material;
reacting the fluorinating agent with the crystal raw material to produce volatile gases and removing the volatile gases from the muffle furnace;

heating the crystal raw material to form a melt; and
solidifying the melt to form the crystal pre-melt.

2. The method of claim 1, wherein solidifying the melt comprises forming droplets from the melt and solidifying the droplets to form the crystal pre-melt.

3. The method of claim 1, wherein the fluorinating agent is a gas selected from the group consisting of $CF_4$, $NF_3$, $SF_6$, $BF_3$, $C_2F_4$, HF, $F_2$, and mixtures thereof, and similar fluorinating gases known in the art.

4. The method of claim 3, wherein the fluorinating agent is supplied into the muffle furnace in a stream of inert gas.

5. The method of claim 1, wherein the fluorinating agent is a solid mixed with the crystal raw material prior to disposing the crystal raw material in the temperature-controlled zone.

6. The method of claim 1, wherein the non-porous refractory material is selected from the group consisting of quartz, alumina, silicon carbide, vitreous graphite, vitreous carbon, glassy carbon-coated graphite, and combinations thereof.

7. The method of claim 1, wherein heating the crystal raw material to the treatment temperature occurs in multiple steps.

8. The method of claim 1, wherein heating the crystal raw material to the treatment temperature and heating the crystal raw material to form the melt occur in an inert atmosphere.

9. The method of claim 1, wherein disposing the crystal raw material in the temperature-controlled zone comprises loading the crystal raw material into a crucible and disposing the crucible in the temperature-controlled zone.

10. The method of claim 1, wherein disposing the crystal raw material in the temperature-controlled zone comprises suspending the crystal raw material in pressed powder form in the temperature-controlled zone without use of a crucible.

11. The method of claim 1, wherein the crystal material is a metal fluoride selected from the group consisting of $CaF_2$, $BaF_2$, $MgF_2$, $SrF_2$, LiF, NaF, $(M_1)_x(M_2)_{1-x}F_2$, and $M_3AlF_6$, and mixtures thereof; and where $M_1$ is selected from the group consisting of Li, K, and lanthanide series metal fluorides; $M_2$ is selected from the group consisting of Ca, Ba, Mg, Sr, and lanthanide series metal fluorides; $M_3$ is selected from the group consisting of Li, Na, K, Rb, and Cs; and x is in a range from 0 to 1.

* * * * *